United States Patent
Chandrakumar et al.

(10) Patent No.: US 7,466,127 B2
(45) Date of Patent: Dec. 16, 2008

(54) METHOD OF 2D-NMR CORRELATION SPECTROSCOPY WITH DOUBLE QUANTUM FILTRATION FOLLOWED BY EVOLUTION OF SINGLE QUANTUM TRANSITIONS

(75) Inventors: Narayanan Chandrakumar, Chennai (IN); Velusamy Ramesh, Kodumudi (IN)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/812,820

(22) Filed: Jun. 22, 2007

(65) Prior Publication Data

US 2008/0129288 A1 Jun. 5, 2008

(30) Foreign Application Priority Data

Jul. 4, 2006 (IN) ............................. 669/KOL/06

(51) Int. Cl.
*G01V 3/00* (2006.01)
(52) U.S. Cl. ........................... 324/307; 324/309
(58) Field of Classification Search ................. 324/307, 324/309
See application file for complete search history.

(56) References Cited

U.S. PATENT DOCUMENTS

| | | | |
|---|---|---|---|
| 4,703,270 A * | 10/1987 | Hall et al. ................. | 324/309 |
| 4,714,882 A * | 12/1987 | Nagayama ................. | 324/307 |
| 5,045,790 A * | 9/1991 | Hall et al. ................. | 324/307 |
| 5,168,229 A * | 12/1992 | Hurd et al. ................ | 324/309 |
| 6,133,736 A * | 10/2000 | Pervushin et al. .......... | 324/307 |
| 6,184,683 B1 * | 2/2001 | Emsley et al. ............. | 324/309 |

OTHER PUBLICATIONS

Aue, W. P.; Bartholdi, E.; Ernst, R. R. J. Chem. Phys. 1976, 64, 2229-2246.
Bax, A.; Freeman, R.; Kempsell, S.P. J. Am. Chem. Soc. 1980, 102, 4849-4851.
Bax, A.; Freeman, R.; Frenkiel, T.A.; Levitt, M.H.; J. Magn. Reson. 1981, 43, 478-483.
Nielsen, N.C.; Thøgersen, H.; Sørensen, O.W. J. Am. Chem. Soc. 1995, 117, 11365-11366.
Nielsen, N.C.; Thøgersen, H.; Sørensen, O.W. J. Chem. Phys. 1996, 105, 3962-3968.
Meissner, A.; Sørensen, O.W. Concept Magn. Reson. 2002, 14, 141-154.
Turner, D. L. Mol. Phys.1981, 44, 1051-1058.
Turner, D. L. J. Magn. Reson.1982, 49, 175-178.
Stoustrup, J.; Schedletzky, O.; Glaser, S.J.; Griesinger, C.; Nielsen, N.C.; Sørensen, O.W. Phys. Rev. Lett. 1995, 74, 2921-2924.
Schulte-Herbrüggen, T.; Madi, Z.L.; Sørensen, O.W.; Ernst, R. R. Mol. Phys.1991, 72, 847-871.
Glaser, S.J.; Drobny, G.P. Adv. Magn. Reson.1990, 14, 35-58.

* cited by examiner

*Primary Examiner*—Louis M Arana
(74) *Attorney, Agent, or Firm*—Paul Vincent

(57) ABSTRACT

A method of 2-dimensional nuclear magnetic resonance (2D-NMR) correlation spectroscopy, comprises a pulse sequence with the following steps: excitation of double quantum coherence; immediate reconversion to single transition single quantum coherence; evolution of the set of single transitions; mixing with zero quantum mixing Hamiltonian; and signal detection. The method can achieve an improved sensitivity, has a transition selectivity and suppresses diagonal peaks.

17 Claims, 4 Drawing Sheets

METHOD OF 2D-NMR CORRELATION SPECTROSCOPY WITH DOUBLE QUANTUM FILTRATION FOLLOWED BY EVOLUTION OF SINGLE QUANTUM TRANSITIONS

This application claims Paris Convention priority of IN 669/KOL/06 filed Jul. 04, 2006 the complete disclosure of which is hereby incorporated by reference.

BACKGROUND OF THE INVENTION

The invention relates to a method of two-dimensional nuclear magnetic resonance (2-D NMR) correlation spectroscopy, wherein double quantum coherence (DQC) is excited.

Such a method is known, e.g., from A. Bax et al., J. Am. Chem. Soc. 1980, 102, p. 4849-4851 (compare Ref. 2).

Nuclear magnetic resonance (NMR) is a powerful tool for investigating the chemistry of a sample. NMR measures the reaction of the spins of the nuclei within the sample upon excitation with high frequency electromagnetic pulses.

2D NMR[1] techniques are especially useful to identify spin correlations which in turn reflect the bonding or spatial topology of the molecule. For low abundance spins, the correlation information has been produced by exciting Double Quantum Coherence (DQC)[2,3] which is subsequently reconverted following evolution by either a single pulse (of flip angle typically 45°, 60°, 90°, 120° or 135°), or alternatively by a cluster of pulses as in the 2D INADEQUATE CR sequence[4-6]. 2D INADEQUATE CR has been designed to provide the maximum sensitivity and results in transition selectivity in F2. These experiments result in spectra whose F1 frequencies are sums of the chemical shifts of each pair of coupled spins. COSY- or SECSY-type displays for $^{13}C$ spin systems are also known in the literature[7,8]. These methods afford sub-optimal sensitivity, however, there being no transition selectivity.

SUMMARY OF THE INVENTION

It is the object of the invention to propose a method of 2D-NMR correlation spectroscopy which can achieve an improved sensitivity and which has a transition selectivity.

This object is achieved, in accordance with the invention, by a method of 2-dimensional nuclear magnetic resonance (2D-NMR) correlation spectroscopy, comprising a pulse sequence with the following steps:
 i) excitation of double quantum coherence;
 ii) immediate reconversion to single transition single quantum coherence;
 iii) evolution of the set of single transitions;
 iv) mixing with zero quantum mixing Hamiltonian;
 v) signal detection.

This method is further referred to as LASSY.

The object is also achieved, in accordance with the invention, by a method of 2D-NMR correlation spectroscopy, comprising a pulse sequence with the following steps:
 i) excitation of double quantum coherence;
 ii) immediate reconversion with a 90° pulse;
 iii) evolution of the set of anti-phase single quantum transitions;
 iv) mixing with zero quantum mixing Hamiltonian;
 v) signal detection.

This method is further referred to as LAPSY.

The basic idea of the invention, as realized in LASSY and LAPSY, is to adopt a double quantum coherence excitation and an immediate reconversion, followed by a single quantum evolution. This is in contrast to the procedures of the state of the art, where a double quantum evolution is followed by double quantum reconversion.

The inventive approach employs a double quantum filter to discriminate against uncoupled spins, which is particularly useful for nuclei of low abundance in a sample. The subsequent conversion to single quantum coherence (SQC) introduces transition selectivity. The evolution of single quantum coherence further improves the spectral resolution and reduces relaxation losses, as compared to an evolution of DQC. In addition, with the inventive methods, diagonal peaks are suppressed.

In a preferred variant of the inventive LASSY method, during step ii), a conversion to a single transition at each of the chemical shifts of two coupled spins is done. By this way, the transition selectivity can be achieved in a simple way. The selection of the desired component (high-field or low-field component of each doublet, or the so-called p or a component) may be achieved by employing suitable phases of the reconversion pulses.

In another preferred variant of the inventive LASSY method, in step ii), the double quantum re-conversion is detuned with a first pulse having a flip angle other than 45°, preferably a reduced flip angle, in particular a flip angle of 20°-30°. This facilitates the measurement of shifts and couplings.

In the following, variants of both above inventive methods (LASSY and LAPSY) are introduced.

One preferred variant of the inventive methods provides that in step iv), isotropic mixing is done. This is a simple and fast way of doing the mixing step. In particular, a GD-1 sequence can be applied.

In a further development of this variant, in step iv), isotropic mixing is performed with sequences optimized for chemical shift bandwidth and/or coupling bandwidth.

As an advantageous alternative to the above mentioned variant, in step iv), a cascade of two bilinear rotations is applied. Although taking longer, this variant avoids bandwidth vs. power deposition issues.

Optionally, this variant may be further developed by the cascade of two bilinear rotations including pulse contraction.

Another preferred variant of the inventive method is characterized in that a π pulse is applied just before or right after step iv). This permits echo pathway selection, while transferring coherence from one doublet component in F1 to the other doublet component in F2.

Another preferred variant of the inventive methods provides that suitable offset compensated pulses or offset compensated groups of pulses are employed.

Also preferred is a variant, wherein the pulse sequence is adapted for indirect detection. Then the improvement in sensitivity is particularly evident.

In a highly preferred variant, the method is used with C-13 nuclei. C-13 can be used with the invention in natural abundance, as already practiced, avoiding any enriching of isotopes in the sample.

In a practically important variant of the inventive methods, the method is used with solution samples. Alternatively, and also relevant in practice, the method is used with solid state samples, preferably applying magic angle spinning (MAS), in particular with Si-29 and/or C-13 nuclei.

In a highly preferred variant of the inventive methods, the method is used with rare spin-1/2 systems. This variant can be applied with samples in any phase. The rarity of the spin-1/2 system guarantees single coupling between two spins-1/2. Note that according to the invention, a spin system is considered as rare if its abundance in the sample is 10% or less, and preferably 5% or less.

In an alternative, also preferred variant, the method is used with spin-1-systems in ordered phases, in particular with H-2, Li-6, N-14. The ordered phase guarantees quadrupolar coupling of a spin-1. This variant can be performed independent of the abundance of the spin-1 system. An ordered phase, suitable for the invention, is for example a liquid crystal.

Finally, in a preferred variant, the method is adapted to generate magnitude mode spectra or pure phase spectra. Magnitude mode spectra can be produced by selecting the echo or anti-echo, employing phase cycling as described below or by using gradients. Pure phase spectra are also typically produced by using gradients or phase cycling in alternative procedures.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

The invention proposes a new family of pulse experiments for correlation spectroscopy of low abundance spins, that results in diagonal suppression and optimal sensitivity with single transition 2D 'multiplet' structure in the cross peaks. The sequence also has better relaxation tolerance than corresponding DQ experiments. Implementation involves a double quantum filter followed by reconversion to single transition single quantum coherence, then evolution followed by isotropic mixing or a laboratory frame bilinear analog. These sequences are useful not only in $^{13}$C NMR in solution state, but also $^{29}$Si MAS NMR in the solid state and the NMR of spin-1 systems in ordered phases. An 'anti-phase' version of the experiment is also pointed out.

More specifically, this document proposes—and demonstrates for $^{13}$C at natural abundance—a family of new pulse sequences to achieve the maximum sensitivity as predicted by the relevant unitary bound[9], while also achieving a diagonal suppressed COSY display with transition selectivity. F1 spectral widths are now governed by the normal single quantum spectral window, resulting in superior resolution; furthermore, since it is Single Quantum Coherence (SQC) that evolves during $t_1$ and not DQC, relaxation losses may be expected to be typically lower per unit time, as also the single quantum linewidths.

The inventive approach is based on employing a double quantum filter to discriminate against uncoupled spins, followed by conversion to single quantum coherence with transition selectivity (i.e. conversion to a single transition at each of the chemical shifts of the two coupled spins). Evolution of the set of single transitions then follows, terminated by a zero quantum mixing Hamiltonian, followed by signal detection. Echo (or anti-echo) selection is governed by the addition (or not) of a $\pi$ pulse just before/right after mixing. Addition of the said pulse results not only in echo pathway selection, but also the selection of different multiplet components in F1 and in F2 (e.g. the low field component in F1 and the high field component in F2). As described below, this permits the spectroscopist to deduce shifts and couplings despite the selection of only one component out of the cross-peak multiplet—which should normally have four components.

We call these experiments Low Abundance Single transition correlation SpectroscopY (LASSY) and dub them CLASSY for C-13 applications.

Figure 1:
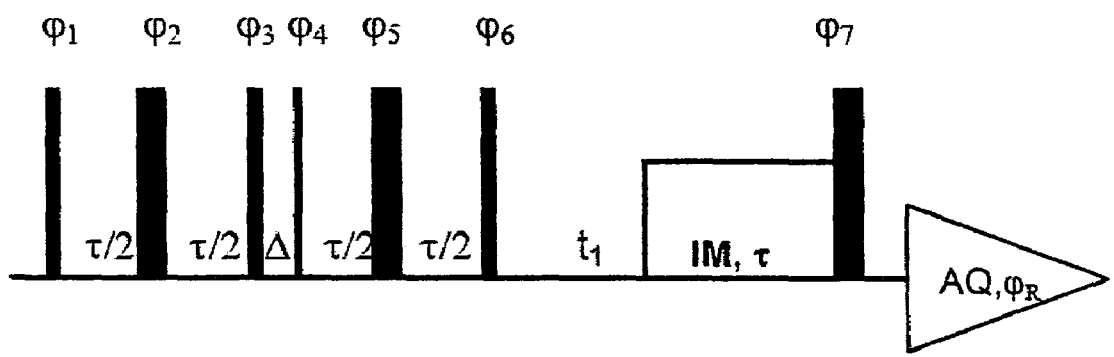
FIG. 1 shows schematically a 2D LASSY sequence with isotropic mixing, in accordance with the invention.

FIG. 1 illustrates a 2D LASSY sequence with isotropic mixing. Here $\tau=(2J)^{-1}$, $\Delta=10\,\mu s$. Pulse flip angles are proportional to the width of the corresponding bars: the widest represent 180° pulses, while the narrowest represents a 45° (or shorter) pulse, the intermediate width representing 90° pulses. The phase cycling is given as:

$\phi_1$: $\{4(x),4(y),4(-x),4(-y)\}$; $\phi_2$: $\{4(x),4(y),4(-x),4(-y), 4(-x),4(-y),4(x),4(y)\}$;

$\phi_3$: $\{4(x),4(y),4(-x),4(-y)\}$; ($\phi_4$: $\{(x, -y, -X, y\}$; $\phi_5$: $\{8(x, -y, -x, y), 8(-x, y, x, -y,)\}$;

($\phi_6$: $\{-y, -x, y, x\}$; $\phi_7$: $\{128(x), 128(-x)\}$; $\phi_R$: $\{-X, y, X, -y, X, -y, -X, y\}$.

Figure 2:
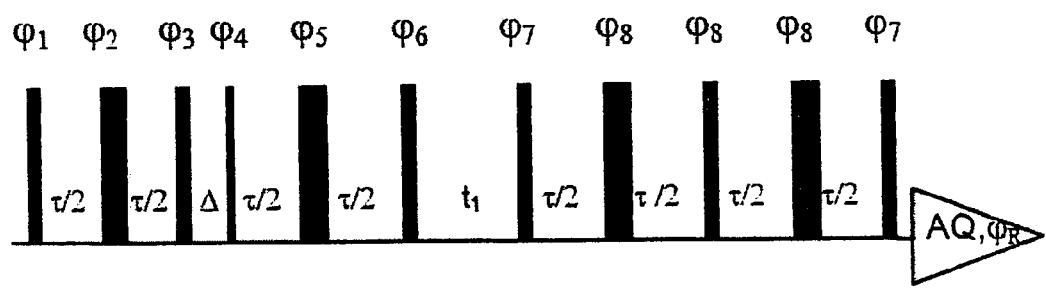
FIG. 2 shows schematically a 2D LASSY sequence with ZQ (zero quantum) planar mixing, in accordance with the invention.

FIG. 2 illustrates a 2D LASSY sequence with ZQ planar mixing. Here, $\tau=(2J)^{-1}$, $\Delta=10\,\mu s$. The phase cycling is given by:

$\phi_1$: $\{4(x),4(y)\}$; $\phi_2$: $\{4(x),4(y),4(-x),4(-y)\}$; $\phi_3$: $\{4(x),4(y)\}$; $\phi_4$: $\{x, -y, -X, y\}$;

$\phi_5$: $\{4(x, -y, -x, y), 4(-x, y, x, -y)\}$; $\phi_6$: $\{-y, -x, y, x\}$;

$\phi_7$: $\{32(y), 32(-x), 32(-y), 32(x)\}$; $\phi_8$: $\{32(x), 32(y), 32(-x), 32(-y)\}$;

$\phi_R$: $\{4(-x, y, x, -y, x, -y, -x, y), 4(x, -y, -x, y, -x, y, x, -y)\}$.

Mixing is accomplished by a suitable zero quantum Hamiltonian, that may be generated by isotropic mixing or by a cascade of two appropriate bilinear rotations (which may include a pulse contraction)[10]. The sequence of transformations of the spin density matrix may be given as follows:

$$I_{1z} + I_{2z} \xrightarrow{90°_x} -(I_{1y} + I_{2y}) \xrightarrow{180°_x} (I_{1y} + I_{2y}) \xrightarrow{\tau=(2J)^{-1}}$$

$$-2(I_{1x}I_{2z} + I_{1z}I_{2x}) \xrightarrow{90°_x} 2(I_{1x}I_{2y} + I_{1y}I_{2x}) \xrightarrow{45°_x}$$

$$\sqrt{2}\,(I_{1x}I_{2y} + I_{1y}I_{2x}) + \sqrt{2}\,(I_{1x}I_{2z} + I_{1z}I_{2x}) \xrightarrow{180°_x}$$

$$-\sqrt{2}\,(I_{1x}I_{2y} + I_{1y}I_{2x}) - \sqrt{2}\,(I_{1x}I_{2z} + I_{1z}I_{2x}) \xrightarrow{\tau=(2J)^{-1}} -\sqrt{2}$$

$$(I_{1x}I_{2y} + I_{1y}I_{2x}) - \frac{1}{\sqrt{2}}(I_{1y} + I_{2y}) \xrightarrow{90°_{-y}}$$

$$-\sqrt{2}\,(I_{1z}I_{2y} + I_{1y}I_{2z}) - \frac{1}{\sqrt{2}}(I_{1y} + I_{2y}) \equiv \frac{i(I_1^+ - I_1^-)I_2^\alpha}{\sqrt{2}} + \frac{iI_1^\alpha(I_2^+ - I_2^-)}{\sqrt{2}}$$

Considering the further evolution of the transverse magnetization of the first spin, we find:

$$\frac{i(I_1^+ - I_1^-)I_2^\alpha}{\sqrt{2}} \xrightarrow{\delta_1 I_{1z}} \frac{i(I_1^+ e^{-i\delta_1 t_1} - I_1^- e^{i\delta_1 t_1})I_2^\alpha}{\sqrt{2}} \xrightarrow{2\pi J I_{1z}I_{2z}}$$

$$\frac{i}{\sqrt{2}}(I_1^+ e^{-i\delta_1 t_1}e^{-i\pi J t_1} - I_1^- e^{i\delta_1 t_1}e^{i\pi J t_1})I_2^\alpha \xrightarrow{IM,\tau=(2J)^{-1}}$$

-continued $$\frac{i}{\sqrt{2}} I_1^\alpha (I_2^+ e^{-i(\delta_1 + \pi J)t_1} - I_2^- e^{i(\delta_1 + \pi J)t_1}) \xrightarrow{\pi_x}$$

$$\frac{i}{\sqrt{2}} I_1^\beta (I_2^- e^{-i(\delta_1 + \pi J)t_1} - I_2^+ e^{i(\delta_1 + \pi J)t_1})$$

In general, isotropic mixing of two spins/and S for an arbitrary duration $\tau$ gives rise to:

$$I_+ S^\alpha \xrightarrow{IM,\tau} \frac{1}{2}(1 + e^{-2\pi i J \tau}) I_+ S^\alpha + \frac{1}{2}(1 - e^{-2\pi i J \tau}) I^\alpha S_+$$

The implementation used here includes a terminal $\pi$ pulse in the case of isotropic mixing (which we currently realize with the GD-1 sequence[11]); this permits echo pathway selection, while transferring coherence from one doublet component in F1 to the other doublet component in F2. In the implementation with a sequence of two bilinear rotations, this may be achieved by suitably setting the phase of the last pulse relative to that of the first pulse. It may be noted that mixing with a zero quantum effective Hamiltonian effectively suppresses diagonal peaks, employing an appropriate mixing period $\tau$ that may be chosen in light of the range of values of J in the molecule. The ratio of cross-peak to diagonal peak intensities can be shown in fact to be given by:

$$i \frac{\sin 2\pi J \tau}{(1 + \cos 2\pi J \tau)}.$$

It may further be noted that with either of the implementations indicated above, the shifts and couplings may be retrieved from the spectrum despite transition selectivity, although in practice the accuracy is a function of the F1 resolution.

The scalar coupling and chemical shift may be calculated as follows. The LASSY spectrum of a coupled two-spin-1/2 system has two cross peaks, each with one multiplet component. These components correspond to different coupled spin states in the two dimensions. The (F1, F2) co-ordinates of the cross-peak detected at the second spin frequency are $(v_1+J/2, v_2-J/2)$, v's being chemical shift frequencies expressed in Hz. The (F1, F2) co-ordinates of the cross-peak detected at the first spin frequency on the other hand are $(v_2+J/2, v_1-J/2)$. The scalar coupling may be obtained by subtracting the F2 frequency of this cross peak from the F1 frequency of the other cross peak:

$$J = (v_1+J/2)^{F1} - (v_1-J/2)^{F2}.$$

The chemical shifts may now be easily obtained.

Figure 3:
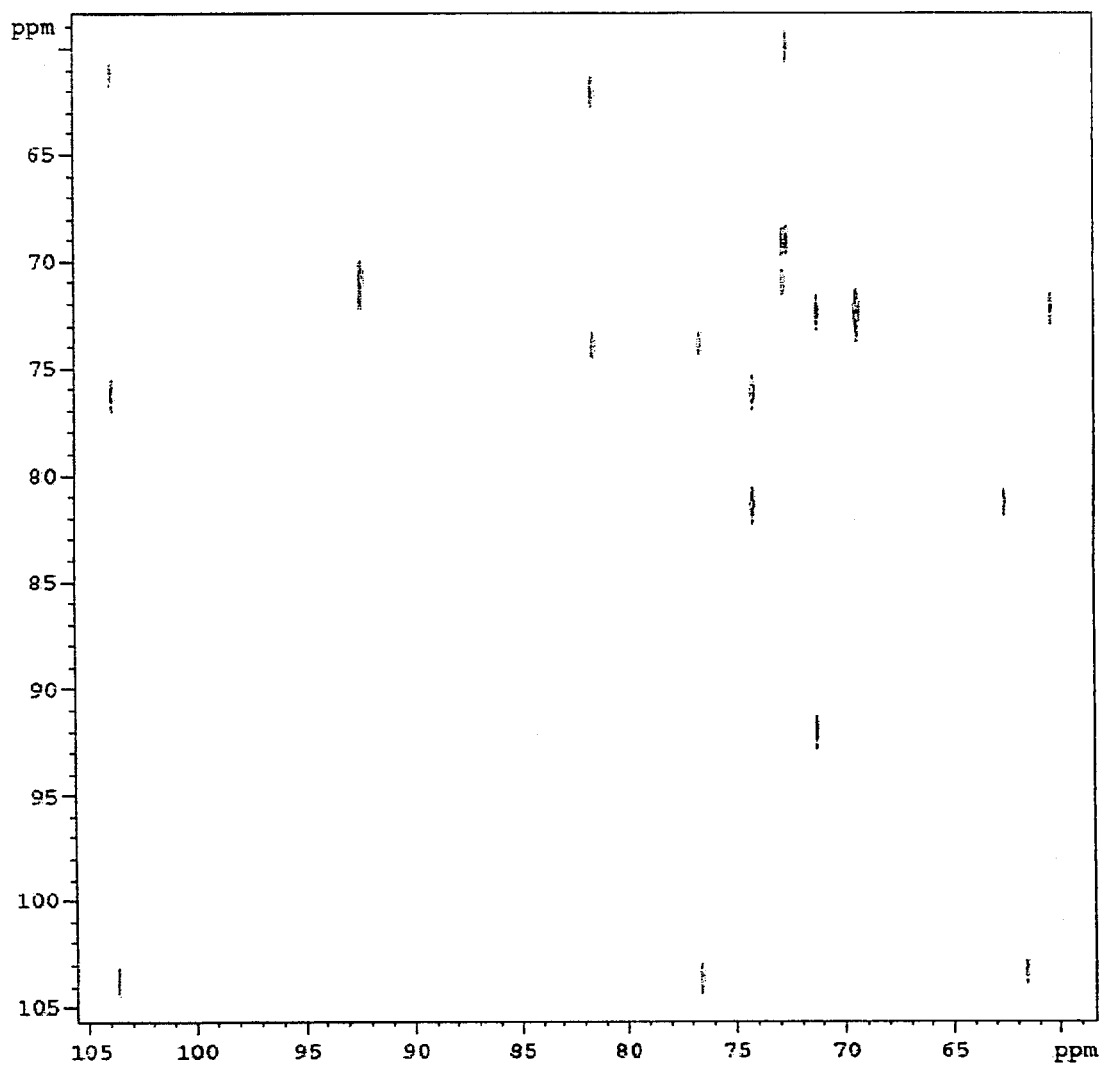
FIG. 3 shows an experimentally obtained 2D LASSY spectrum of 0.5M sucrose.

FIG. 3 illustrates a 2D LASSY spectrum of 0.5 M sucrose. Isotropic mixing has been implemented employing the GD-1 sequence. 64 $t_1$ points are acquired, each with 256 scans and 5k points in $t_2$.

Bandwidth vs. power deposition issues of isotropic mixing sequences may be avoided by employing two successive bilinear mixing sequences, although this does involve an extra mixing time of $(2J)^{-1}$.

It is noted that 'detuning' the double quantum re-conversion sequence with the first pulse having a flip angle other than 45° (say, 20°-30°) also affords near-optimum sensitivity, while permitting the measurement of shifts and couplings, since it results in cross peaks that have one strong component and one weak component, diagonally displaced with respect to each other, with the intensity ratio of −3.73:1 (for 30° flip angle of the first re-conversion pulse).

These experiments avoid spectral registration by evolution of double quantum coherence. This has a significant consequence on resolution in F1 as well as on overall experiment sensitivity, since homonuclear double quantum coherence of rare spins in solution state is typically principally relaxed by their heteronuclear dipolar interactions with protons. Such double quantum relaxation is considerably more efficient than the relaxation of the corresponding single quantum coherence of rare spins, under extreme narrowing conditions. For larger molecular weights and/or higher magnetic field intensities, this is even more so, since the spectral density at zero frequency plays a significant role. Avoiding the evolution of DQC for ca. 100-200 ms and substituting this with DQ filtering (which lets the state of DQC persist for merely ca. 10-15 ms) could thus prove to be a major boon in biomolecular NMR as well.

It is further noted that an alternative approach that involves excitation of DQC, followed by immediate reconversion with a 90° pulse, then spin evolution and mixing as before, also leads to diagonal suppressed correlation spectra. These spectra exhibit cross peaks, each with two multiplet components that are diagonally displaced. While this permits accurate quantification of the coupling constant, sensitivity is clearly sub-optimal (70% of the sensitivity of LASSY). This experiment may be termed Low abundance Anti-Phase correlation SpectroscopY (LAPSY). The 2D LAPSY pulse sequence is shown in FIG. 4.

Figure 4:
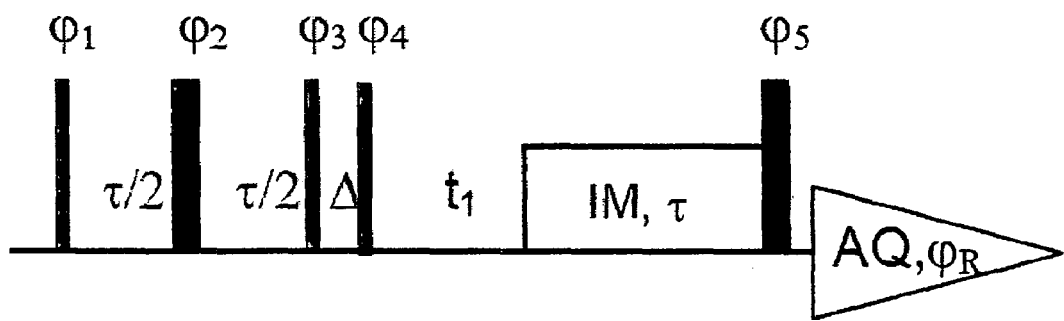
FIG. 4 shows a 2D LAPSY sequence with isotropic mixing, in accordance with the invention.

FIG. 4 illustrates a 2D LAPSY sequence with Isotropic mixing. Here, $\tau=(2J)^{-1}$, $\Delta=10$ μs.

Offset compensated versions of these experiments may be developed. The protocol may also be adapted for indirect detection. In particular, this set of experiments may also be extended to the solid state (e.g. $^{29}$Si MAS NMR) and to spin-1 systems ($^2$H, $^6$Li, $^{14}$N) in ordered phases.

The invention describes a novel pulse sequence for rare spin 2D NMR correlation spectroscopy, that suppresses diagonal responses and maximizes cross-peak sensitivity, yet avoids double quantum evolution as generated by standard pulse sequences, as practiced in the prior art.

The invention further describes a novel pulse sequence for rare spin 2D NMR correlation spectroscopy, that has a superior resolution in the indirect dimension F1 than the double quantum experiments generated by standard pulse sequences, as practiced in the prior art.

The invention further describes a novel pulse sequence for rare spin 2D NMR correlation spectroscopy, that has superior sensitivity overall, than the double quantum experiments generated by standard pulse sequences, as practiced in the prior art. This arises because the relaxation of double quantum coherence during the evolution time in standard pulse sequences can lead to approximately twice as much signal loss per unit time as the relaxation of single transition single quantum coherence—and in fact could be far more lossy for larger molecules (such as biomolecules) and higher magnetic filed intensities of NMR measurement.

The invention further describes a novel pulse sequence for rare spin 2D NMR correlation spectroscopy, that permits the experimenter to deduce the spin couplings and chemical shifts, despite selecting a single transition in each 'cross-peak' multiplet, by a procedure outlined in the text. Alternatively, another embodiment of the present invention where the flip angle of the first DQ reconversion pulse is reduced, permits this information to be deduced by generating a second peak in the cross-peak multiplet with only marginal sacrifice of sensitivity, as described in the text.

The invention further describes a novel pulse sequence for rare spin 2D NMR correlation spectroscopy, that has the capabilities noted above when applied to the NMR of spin-1 systems in ordered phases (e.g. $^2$H, $^6$Li, $^{14}$N in liquid crystalline phase) and permits discrimination between isotropic and ordered phases in this application.

Finally, the invention describes a novel pulse sequence for rare spin 2D NMR correlation spectroscopy, that has the capabilities noted above when applied to NMR in the solid state with magic angle sample spinning, for example the NMR of $^{13}$C, $^{29}$Si, etc.

REFERENCES

1. Aue, W. P.; Bartholdi, E.; Ernst, R. R. J. Chem. Phys. 1976, 64, 2229-246.
2. Bax, A.; Freeman, R.; Kempsell, S. P. J. Am. Chem. Soc. 1980, 102, 4849-4851.
3. Bax, A.; Freeman, R.; Frenkiel, T. A.; Levitt, M. H.; J. Magn. Reson. 1981, 43, 478-483.
4. Nielsen, N. C.; Thøgersen, H.; Sørensen, O. W. J. Am. Chem. Soc. 1995, 117, 11365-11366.
5. Nielsen, N. C.; Thøgersen, H.; Sørensen, O. W. J. Chem. Phys. 1996, 105, 3962-3968.
6. Meissner, A.; Sørensen, O. W. Concept Magn. Reson. 2002, 14, 141-154.
7. Turner, D. L. Mol. Phys. 1981, 44, 1051-1058.
8. Turner, D. L. J. Magn. Reson. 1982, 49, 175-178.
9. Stoustrup, J.; Schedletzky, O.; Glaser, S. J.; Griesinger, C.; Nielsen, N. C.; Sørensen, O. W. Phys. Rev. Lett. 1995, 74, 2921-2924.
10. Schulte-Herbrüggen, T.; Madi, Z. L.; Sørensen, O. W.; Ernst, R. R. Mol. Phys. 1991, 72, 847-871.
11. Glaser, S. J.; Drobny, G. P. Adv. Magn. Reson. 1990, 14, 35-58.

We claim:

1. A method of 2-dimensional nuclear magnetic resonance (2D-NMR) correlation spectroscopy having a pulse sequence comprising the following steps:
   a) exciting a double quantum coherence;
   b) immediately reconverting to single transition, single quantum coherence;
   c) evolving a set of single transitions;
   d) mixing with a zero quantum mixing Hamiltonian; and
   e) detecting signals.

2. The method of claim 1, wherein during step b), a conversion to a single transition at each of chemical shifts of two coupled spins is effected.

3. The method of claim 1, wherein, in step b), a double quantum re-conversion is detuned with a first pulse having a flip angle other than 45°, a reduced flip angle or a flip angle of 20°-30°.

4. A method of 2D-NMR correlation spectroscopy having a pulse sequence comprising the following steps:
   a) exciting a double quantum coherence;
   b) immediately reconverting using a 90° pulse;
   c) evolving a set of anti-phase single quantum transitions;
   d) mixing with a zero quantum mixing Hamiltonian; and
   e) detecting signals.

5. The method of claim 1, wherein in step d), isotropic mixing is effected.

6. The method of claim 5, wherein in step d), isotropic mixing is effected with sequences optimized for chemical shift bandwidth and/or coupling bandwidth.

7. The method of claim 1, wherein, in step d), a cascade of two bilinear rotations is applied.

8. The method of claim 7, wherein a cascade of two bilinear rotations includes pulse contraction.

9. The method of claim 1, wherein a π pulse is applied just before or right after step d).

10. The method of claim 1, wherein suitable offset compensated pulses or offset compensated groups of pulses are employed.

11. The method of claim 1, wherein the pulse sequence is adapted for indirect detection.

12. The method of claim 1, wherein C-13 nuclei are used.

13. The method of claim 1, wherein solution samples are used.

14. Te method of claim 1, wherein solid state samples are used or are used while applying magic angle spinning (MAS) or Si-29 and/or C-13 nuclei are used.

15. The method of claim 1, wherein rare spin-1/2 systems are used.

16. The method of claim 1, wherein spin-1-systems in ordered phases, H-2, Li-6, or N-14 are used.

17. The method of claim 1, wherein the method is adapted to generate magnitude mode spectra or pure phase spectra.

* * * * *